US012648273B2

(12) United States Patent
Joo et al.

(10) Patent No.: US 12,648,273 B2
(45) Date of Patent: Jun. 2, 2026

(54) COLOR CONVERSION PANEL AND DISPLAY DEVICE INCLUDING SAME

(71) Applicant: Samsung Display Co., LTD., Yongin-si (KR)

(72) Inventors: Sun-Kyu Joo, Yongin-si (KR); Keun Chan Oh, Yongin-si (KR); Min-Jae Kim, Yongin-si (KR); Jae Cheol Park, Yongin-si (KR); Dokyung Youn, Yongin-si (KR); Yeo Geon Yoon, Yongin-si (KR); Chang-Hun Lee, Yongin-si (KR); Woo-Man Ji, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 552 days.

(21) Appl. No.: 18/167,182

(22) Filed: Feb. 10, 2023

(65) Prior Publication Data

US 2023/0335686 A1      Oct. 19, 2023

(30) Foreign Application Priority Data

Apr. 14, 2022      (KR) ......................... 10-2022-0046494

(51) Int. Cl.
H10H 20/851      (2025.01)
H10H 20/857      (2025.01)
H10W 90/00      (2026.01)

(52) U.S. Cl.
CPC ...... H10H 20/8514 (2025.01); H10H 20/857 (2025.01); H10W 90/00 (2026.01)

(58) Field of Classification Search
None
See application file for complete search history.

(56)      References Cited

U.S. PATENT DOCUMENTS

| | | | |
|---|---|---|---|
| 8,405,063 B2 | 3/2013 | Kazlas et al. | |
| 2014/0231790 A1 | 8/2014 | Fujino | |
| 2020/0295090 A1 | 9/2020 | Cho et al. | |
| 2022/0059799 A1* | 2/2022 | Kim ..................... | H10K 59/879 |
| 2023/0255080 A1* | 8/2023 | Lee .................... | H10K 59/8792 |
| | | | 257/91 |

FOREIGN PATENT DOCUMENTS

| | | |
|---|---|---|
| KR | 20140083988 A | 7/2014 |
| KR | 1020190000759 A | 1/2019 |
| KR | 1020200026381 A | 3/2020 |
| KR | 20200110581 A | 9/2020 |
| KR | 1020210133371 A | 11/2021 |

* cited by examiner

*Primary Examiner* — Richard H Kim
(74) *Attorney, Agent, or Firm* — CANTOR COLBURN LLP

(57)      ABSTRACT

A color conversion panel includes a plurality of banks which partition a first emission area, a second emission area and a third emission area of the color conversion panel at which light of different colors are respectively emitted, a color conversion layer which color-converts light, in the first emission area, and a transmission layer which transmits light without color conversion, in the second emission area and the third emission area.

26 Claims, 15 Drawing Sheets

COLOR CONVERSION PANEL AND DISPLAY DEVICE INCLUDING SAME

This application claims priority to Korean Patent Application No. 10-2022-0046494 filed on Apr. 14, 2022, and all the benefits accruing therefrom under 35 U.S.C. § 119, the entire contents of which are incorporated herein by reference.

BACKGROUND

(a) Field

The present disclosure relates to a color conversion panel and a display device including the same.

(b) Description of the Related Art

In a light emitting device, a hole supplied from an anode and an electron supplied from a cathode are combined in a light emitting layer disposed between the anode and the cathode to form an exciton, and the light emitting device is a device that emits light while this exciton is stabilized.

The light emitting device has several advantages such as a wide viewing angle, a fast response speed, a thin thickness, and low power consumption, and thus is widely applied to various electric and electronic devices such as televisions, monitors, and mobile phones.

A display device including a color conversion panel has been proposed to implement a display device with high efficiency. The color conversion panel color-converts incident light into light having different colors, or transmits the incident light without color-conversion.

SUMMARY

Embodiments have been made in an effort to provide a color conversion panel and a display device including the same, that are capable of simplifying a process of manufacturing (or providing) the display device, and improving light emission efficiency thereof.

An embodiment of the present invention provides a color conversion panel including a substrate, a plurality of banks positioned on the substrate to partition a first emission area, a second emission area, and a third emission area, a color conversion layer positioned in the first emission area, and transmission layers positioned in the second emission area and the third emission area.

The transmission layers positioned in the second emission area and the third emission area may be connected to each other.

The transmission layer may be positioned on a bank positioned between the second emission area and the third emission area.

The transmission layer positioned on the bank may have a protrusion, and the protrusion may constitute a spacer.

The transmissive layer may be positioned on the color conversion layer.

The first emission area may be a red emission area, the second emission area may be a green emission area, and the third emission area may be a blue emission area.

The color conversion layer may further include a red color filter, a green color filter, and a blue color filter positioned on the substrate.

The color conversion layer may further include a red dummy color filter, a green dummy color filter, and a blue dummy color filter positioned between the substrate and the bank.

The blue dummy color filter may be positioned closer to the substrate than the red dummy color filter and the green dummy color filter.

An embodiment of the present invention provides a display device including a color conversion panel and a display panel positioned to overlap the color conversion panel. The display panel includes a first substrate, a plurality of partition walls positioned on the first substrate, and a light emission layer positioned between the partition walls, and the color conversion panel may include a second substrate, a plurality of banks positioned on the second substrate to partition a first light emission area, a second emission area, and a third emission area, a color conversion layer positioned in the first emission area, and transmission layers positioned in the second emission area and the third emission area.

The transmission layers positioned in the second emission area and the third emission area may be connected to each other.

The transmission layer may be positioned on a bank positioned between the second emission area and the third emission area.

The transmission layer positioned on the bank may have a protrusion, and the protrusion may constitute a spacer.

The transmissive layer may be positioned on the color conversion layer.

The light emission layer may emit blue light and green light, and the first emission area may be a red emission area, the second emission area may be a green emission area, and the third emission area may be a blue emission area.

An embodiment of the present invention provides a display device including a first substrate, a plurality of partition walls positioned on the first substrate, a light emission layer positioned between the partition walls, a plurality of banks positioned to overlap the partition walls and to partition a first emission area, a second emission area, and a third emission area, a color conversion layer positioned in the first emission area, and transmission layers positioned in the second emission area and the third emission area.

The transmission layers positioned in the second emission area and the third emission area may be connected to each other.

The transmission layer may be positioned on a bank positioned between the second emission area and the third emission area.

The transmissive layer may be positioned on the color conversion layer.

The light emission layer may emit blue light and green light, and the first emission area may be a red emission area, the second emission area may be a green emission area, and the third emission area may be a blue emission area.

An embodiment of the present invention provides a display device including a first substrate, a plurality of transistors positioned on the first substrate, a plurality of banks positioned on the transistors to partition a first light emission area, a second emission area, and a third emission area, a color conversion layer positioned in the first emission area, transmission layers positioned in the second emission area and the third emission area, and a light emitting device positioned on the color conversion layer and the transmission layers, and the light emitting device may be electrically connected to the transistors.

Light emitted from the light emitting device may pass through the color conversion layer or the transmission layers to exit to the first substrate.

The transistors may be positioned to overlap the banks in a direction that is perpendicular to the first substrate.

Transistors may not overlap the color conversion layer and the transmission layers in a direction perpendicular to the first substrate.

The display device may further include a fourth emission area partitioned by the banks, and a transmission layer may be positioned in the fourth emission area.

The transmissive layer may be positioned on the color conversion layer.

According to the embodiments, it is possible to provide a color conversion panel and a display device including the same, that are capable of simplifying a manufacturing process and improving emission efficiency.

BRIEF DESCRIPTION OF THE DRAWINGS

The above and other advantages and features of this disclosure will become more apparent by describing in further detail embodiments thereof with reference to the accompanying drawings, in which:

FIG. 12 to FIG. 15 are cross-sectional views of a display device according to embodiments.

DETAILED DESCRIPTION

Figure 1:
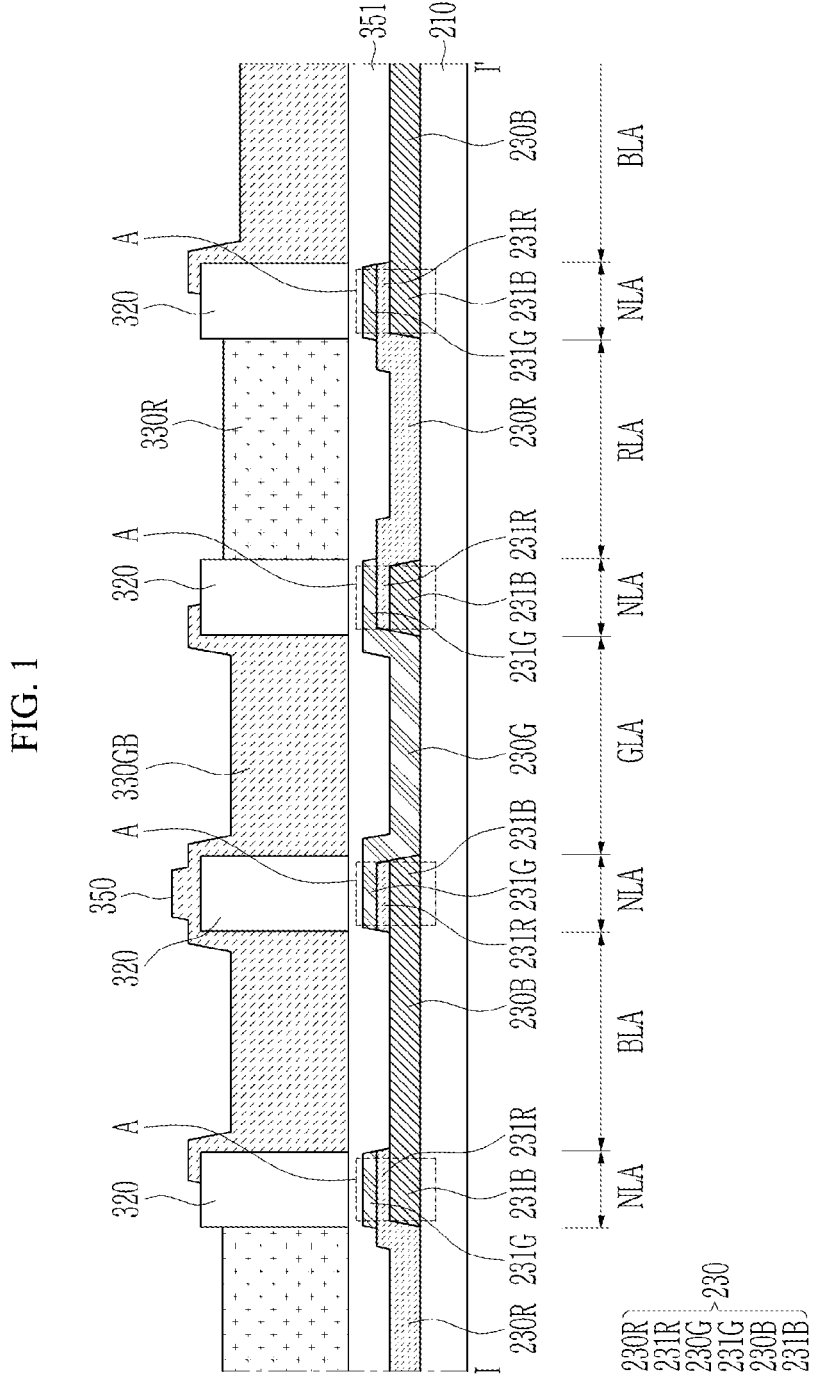
FIG. 1 is a cross-sectional view of a color conversion panel according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

To clearly describe the present invention, parts that are irrelevant to the description are omitted, and like numerals refer to like or similar constituent elements throughout the specification. As used herein, a reference number may indicate a singular element or a plurality of the element. For example, a reference number labeling a singular form of an element within the drawing figures may be used to reference a plurality of the singular element within the text of specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means positioned above or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above or below, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a color conversion panel 200 and a display device including the same according to embodiments of the present invention will be described in detail with reference to the drawings.

FIG. 1 schematically illustrates a color conversion panel 200 according to an embodiment. Referring to FIG. 1, the color conversion panel 200 according to the present embodiment includes a second substrate 210, color filters 230 positioned on the second substrate 210, banks 320 within a bank layer which are positioned between the color filters 230 in a direction along the second substrate 210, and a plurality of color conversion layers 330R and a transmission layer 330 GB positioned between the banks 320. The direction along the second substrate 210 may represent structures along a first direction and/or a second direction which crosses the first direction to define a plane. A vertical direction in FIG. 1 may represent a third direction crossing each of the first and second directions, and may otherwise be referred to as a thickness direction of the display device, of the color conversion panel 200 and/or of various layers or components thereof.

The color conversion panel 200 of FIG. 1 may be positioned to overlap or face a display panel 100. The color conversion panel 200 may follow the display panel 100 along a light emitting direction (or image display direction) of the display panel 100.

The color conversion panel 200 of FIG. 1 may be positioned such that the second substrate 210 faces a first substrate 110 of the display panel 100, and light emitted from the display panel 100 may be emitted through the second substrate 210 after passing through the color conversion layer 330R or the transmission layer 330 GB of the color conversion panel 200 and passing through the color filter 230.

Hereinafter, a configuration of the color conversion panel 200 according to the embodiment of FIG. 1 will be described in detail. A color filter 230 as a color filter layer including a blue color filter 230B, a red color filter 230R, and a green color filter 230G, is positioned on and facing the second substrate 210.

Referring to FIG. 1, a blue dummy color filter 231B is positioned on a same layer as the blue color filter 230B. The blue color filter 230B may be positioned in a blue emission area BLA, and the blue dummy color filter 231B may be positioned in an non-emission area NLA overlapping the banks 320. Although the blue color filter 230B and a blue dummy color filter 231B are illustrated as separate components in FIG. 1, they may be connected in reality.

As being on a same layer, elements may be formed in a same process and/or as including a same material, elements may be in a same layer as each other as respective portions of a same material layer, may be on a same layer by forming an interface with a same underlying or overlying layer, etc., without being limited thereto.

Figure 2:
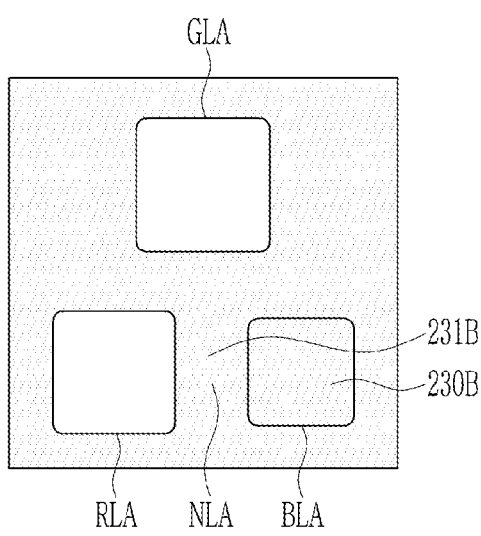
FIG. 2 to FIG. 4 are plan views for illustrating a stacking order of a blue color filter, a red color filter, and a green color filter.
Figure 3:
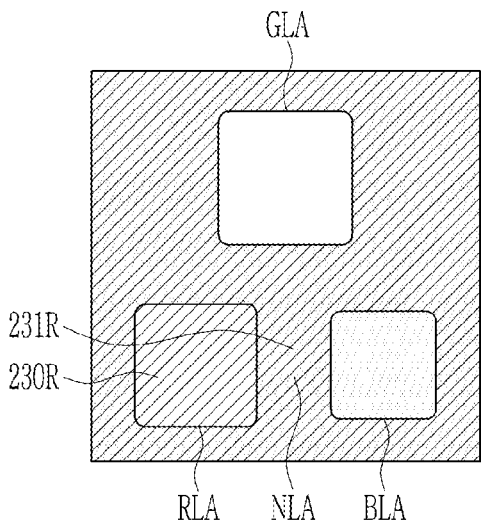
Figure 4:
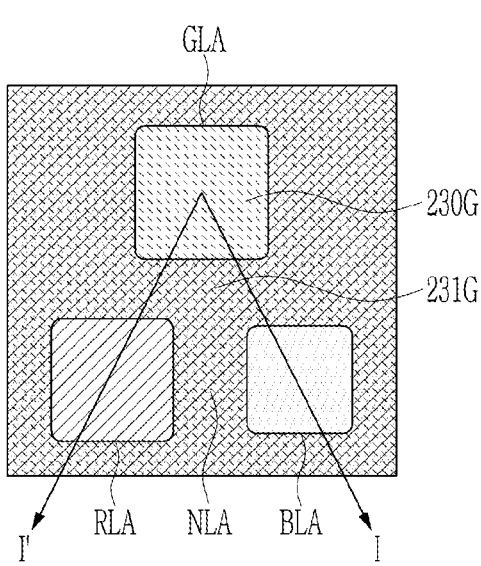

FIG. 2 to FIG. 4 are respective plan views illustrating a stacking order of the blue color filter 230B, the red color filter 230R, and the green color filter 230G. A cross-section taken along a line I-I' in FIG. 4 may correspond to a portion of FIG. 1.

Referring to FIG. 2, the blue color filter 230B is provided in an entire area except for a green emission area GLA and a red emission area RLA. That is, the blue color filter 230B may be provided along an entirety of the second substrate 210 except for regions of the second substrate 210 which correspond to a green emission area GLA and a red emission area RLA. Among such blue color filter portions, a blue color filter portion positioned in the blue emission area BLA is the blue color filter 230B, and a blue color filter portion positioned in the non-emission area NLA is the blue dummy color filter 231B. In FIG. 1, opposite edges of the blue color filter 230B are non-emission areas NLA overlapping the bank 320 at the blue dummy color filter 231B.

Next, referring to FIG. 1 and FIG. 3 together, the red color filter 230R and the red dummy color filter 231R are positioned on the blue color filter 230B and the blue dummy color filter 231B. Referring to FIG. 3, the red color filter 230R is provided in an entire area except for the green emission area GLA and the blue emission area BLA. Among such red color filter portions, a red color filter portion positioned in the red emission area RLA is the red color filter 230R, and a red color filter portion positioned in the non-emission area NLA is the red dummy color filter 231R. In FIG. 1, opposite edges of the red color filter 230R are non-emission areas NLA overlapping the bank 320 at the red dummy color filter 231R.

Next, referring to FIG. 1 and FIG. 4 together, the green color filter 230G and a green dummy color filter 231G are positioned on the blue color filter 230B, the blue dummy color filter 231B, the red color filter 230R, and the red dummy color filter 231R. Referring to FIG. 4, the green color filter 230G is positioned in an entire area except for the blue emission area BLA and the red emission area RLA. Among such green color filter portions, a green color filter portion positioned in the green emission area GLA is the green color filter 230G, and a green color filter portion positioned in the non-emission area NLA is the green dummy color filter 231G. In FIG. 1, opposite edges of the green color filter 230G are non-emission areas NLA overlapping the bank 320 at the green dummy color filter 231G.

Respective color filter portions may together form a color filter layer of a specific color (e.g., the green color filter 230G and a green dummy color filter 231G may together form a green color filter layer). Referring to FIG. 1, the blue dummy color filter 231B, the red dummy color filter 231R, and the green dummy color filter 231G are positioned to overlap in an area overlapping (or corresponding to) the bank 320 as a bank pattern provide in plural within a bank layer. The blue dummy color filter 231B, the red dummy color filter 231R, and the green dummy color filter 231G overlap each other to form a color filter overlapping body A. The color filter overlapping body A may function in a same way as a light blocking member. That is, the color filter overlapping body A may include portions (or patterns) of each of the blue color filter layer, the red color filter layer and the green color filter layer and block light in the non-emission area NLA.

Within the color filter overlapping body A, the blue dummy color filter 231B may be positioned closer to the second substrate 210 than the red dummy color filter 231R and the green dummy color filter 231G. A direction in which an image is viewed from outside the color conversion panel 200, is toward the second substrate 210 from the color filter layer. That is, the blue dummy color filter 231B may be positioned on a surface of the second substrate 210 at which the image is viewed from outside the color conversion panel 200 (or outside the display device), such as be a user. The blue dummy color filter 231B may be positioned closer to the second substrate 210 than the red dummy color filter 231R and the green dummy color filter 231G since, compared to green or red, blue has lowest reflectance for all light and can block light incident from the viewing side of the color conversion panel 200 (e.g., a front of a display device) most effectively.

Referring to FIG. 1, a low refractive index layer 351 may be positioned on the color filter 230. The low refractive index layer 351 may have a refractive index of about 1.2 or less. The low refractive index layer 351 may be a combination of an organic material and an inorganic material.

A plurality of banks 320 of the bank layer are positioned on the low refractive index layer 351. The banks 320 may be positioned to be spaced apart from each other along the low refractive index layer 351, with a plurality of openings defined therebetween. The openings defined by the bank layer may respectively overlap one among the color filters 230R, 230G, and 230B along a thickness direction of the color conversion panel 200, where the thickness direction may be defined a direction that is perpendicular (or normal) to a surface of the second substrate 210.

The banks 320 may include scatterers as a light scatter. The scatterers may include one or more selected from a group including $SiO_2$, $BaSO_4$, $Al_2O_3$, ZnO, $ZrO_2$, and $TiO_2$. The banks 320 may each include a polymer resin and a scatterer which is included in the polymer resin. A content of the scatterers may be about 0.1 weight percent (wt %) to 20 wt %, with respect to total weight of the banks 320. In an embodiment, the content of the scatterers may be about 5 wt % to about 10 wt %. The banks 320 including the scatterers in this range scatter light emitted from the display panel 100 to increase emission efficiency. In an embodiment, the bank 320 may include a black material to block light, and may prevent color mixing between neighboring light emission areas among the blue, green and red emission areas BLA, GLA and RLA.

A red color conversion layer 330R as the color conversion layer 330R, and a transmission layer 330 GB, are respectively positioned in areas between the banks 320 that are spaced apart from each other as solid portions of the bank layer. In FIG. 1, a red color conversion layer 330R is positioned in an area overlapping the red emission area RLA. The red color conversion layer 330R may convert supplied light (e.g., incident light) into red light. The red color conversion layer 330R may include quantum dots.

The quantum dots will be described in detail below.

In the present specification, quantum dots (hereinafter referred to as semiconductor nanocrystals) may include a Group II-VI compound, a Group III-V compound, a Group IV-VI compound, a Group IV element or compound, a Group compound, a Group compound, a Group I-II-IV-VI compound, or a combination thereof.

The Group II-VI compound may be selected from a two-element compound selected from CdSe, CdTe, ZnS, ZnSe, ZnTe, ZnO, HgS, HgSe, HgTe, MgSe, MgS, and a combination thereof, a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group II-VI compound may further include a Group III metal.

The Group III-V compound may be selected from a two-element compound selected from GaN, GaP, GaAs, GaSb, AlN, AlP, AlAs, AlSb, InN, InP, InAs, InSb, and a combination thereof, a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a combination thereof, and a four-element compound selected from GaAlNP, GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, InZnP, and a combination thereof. The Group III-V compound may further include a group II metal (e.g., InZnP).

The Group IV-VI compound may be selected from a two-element compound selected from SnS, SnSe, SnTe, PbS, PbSe, PbTe, and a combination thereof, a three-element compound selected from SnSeS, SnSeTe, SnSTe, PbSeS, PbSeTe, PbSTe, SnPbS, SnPbSe, SnPbTe, and a combination thereof, and a four-element compound selected from SnPbSSe, SnPbSeTe, SnPbSTe, and a combination thereof.

The Group IV element or compound may be selected from a one-element compound selected from Si, Ge, and a combination thereof, and a two-element compound selected from SiC, SiGe, and a combination thereof, but the present invention is not limited thereto.

Examples of the group compound are $CuInSe_2$, $CuInS_2$, CuInGaSe, and CuInGaS. Examples of the group compound include, but are not limited to, CuZnSnSe and CuZnSnS. The Group IV element or compound may be selected from a one-element compound selected from Si, Ge, and a combination thereof, and a two-element compound selected from SiC, SiGe, and a combination thereof.

The Group compound may be selected from ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but the present invention is not limited thereto. The Group I-II-IV-VI compound may be selected from CuZnSnSe and CuZnSnS, but the present invention is not limited thereto.

In an embodiment the quantum dots may not contain cadmium. The quantum dots may include semiconductor nanocrystals based on Group compounds including indium and phosphorus. The Group compound may further contain zinc. The quantum dots may include semiconductor nanocrystals based on a Group II-VI compound including a chalcogen element (e.g., sulfur, selenium, tellurium, or a combination thereof) and zinc.

In the quantum dots, the two-element compound, the three-element compound, and/or the four-element compound described above may be present in particles at uniform concentrations, or they may be divided into states having partially different concentrations to be present in the same particle, respectively. In addition, a core/shell structure in which some quantum dots surround some other quantum dots may be possible. An interface between the core and the shell may have a concentration gradient in which a concentration of elements of the shell decreases closer to a center thereof.

In some embodiments, the quantum dot may have a core-shell structure that includes a core including the nanocrystal described above and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to a center thereof. An example of the shell of the quantum dot includes a metal or nonmetal oxide, a semiconductor compound, or a combination thereof.

Examples of an oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a three-element compound such as $MgAl_2O_4$, $CoFe_2O_4$, $NiFe_2O_4$, or $CoMn_2O_4$.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present invention is not limited thereto.

An interface between the core and the shell may have a concentration gradient in which a concentration of elements of the shell decreases closer to a center thereof. In addition, the semiconductor nanocrystal may have a structure including one semiconductor nanocrystal core and a multilayered shell surrounding the semiconductor nanocrystal core. In an embodiment, the multilayered shell may have two or more layers, such as two, three, four, five, or more layers. The two adjacent layers of the shell can have a single composition or different compositions. Each layer in the multilayered shell may have a composition that varies depending on a radius.

The quantum dot may have a full width at half maximum (FWHM) of the light-emitting wavelength spectrum that is equal to or less than about 45 nanometers (nm), such as equal to or less than about 40 nm, or such as equal to or less than about 30 nm. In these ranges, color purity or color reproducibility may be improved. In addition, since light emitted through the quantum dot is emitted in all directions, a viewing angle of light may be improved.

In the quantum dot, a shell material and a core material may have different energy bandgaps. For example, the energy bandgap of the shell material may be larger than that of the core material. In an embodiment, the energy bandgap of the shell material may be smaller than that of the core material. The quantum dot may have a multilayered shell. In the multilayered shell, the energy bandgap of an outer layer may be larger than that of an inner layer (i.e., a layer closer to the core). In the multilayered shell, the energy bandgap of the outer layer may be smaller than the energy bandgap of the inner layer.

The quantum dot may control an absorption/emission wavelength by controlling a composition and size thereof. A maximum emission peak wavelength of the quantum dot may have a wavelength range of ultraviolet rays to infrared rays or higher.

The quantum dots may have quantum efficiency of about 10% or more, such as about 30% or more, about 50% or more, about 60% or more, about 70% or more, about 90% or more, or even 100%. The quantum dots may have a relatively narrow spectrum. The quantum dots may have, e.g., a half-width of an emission wavelength spectrum of about 50 nm or less, e.g., about 45 nm or less, about 40 nm or less, or about 30 nm or less.

The quantum dots may have a particle size of about 1 nm or more and about 100 nm or less. The particle size refers to a particle diameter or a diameter converted by assuming a spherical shape from a two-dimensional image obtained by transmission electron microscope analysis. The quantum dots may have a size of about 1 nm to about 20 nm, e.g., 2 nm or more, 3 nm or more, or 4 nm or more and 50 nm or less, 40 nm or less, 30 nm or less, 20 nm or less, or 15 nm or less, e.g., 10 nm or less. A shape of the quantum dot is not particularly limited. For example, the shape of the quantum dot may include a sphere, a polyhedron, a pyramid, a multipod, a square, a cuboid, a nanotube, a nanorod, a nanowire, a nanosheet, or a combination thereof, but the present invention is not limited thereto.

The quantum dots are commercially available or may be appropriately synthesized. For the quantum dots, the particle size may be controlled relatively freely during colloid synthesis, and the particle size may be uniformly controlled.

The quantum dot may include an organic ligand (e.g., having a hydrophobic moiety and/or a hydrophilic moiety). The organic ligand moiety may be bonded to a surface of the quantum dot. The organic ligand may include RCOOH, $RNH_2$, $R_2NH$, $R_3N$, RSH, $R_3PO$, $R_3P$, ROH, RCOOR, $RPO(OH)_2$, $RHPOOH$, $R_2POOH$, or a combination thereof, where each R may independently indicate a C3 to C40 (e.g., C5 or more and C24 or less) substituted or unsubstituted alkyl, a C3 to C40 substituted or unsubstituted aliphatic hydrocarbon group such as a substituted or unsubstituted alkenyl, a C6 to C40 (e.g., C6 or more and C20 or less) substituted or unsubstituted aromatic hydrocarbon group such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol, an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributylamine, and trioctylamine, a carboxylic acid compound such as methanic acid, ethanic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid, a phosphine compound such as methyl phosphine, ethyl phosphine, propyl phosphine, butyl phosphine, pentyl phosphine, octyl phosphine, dioctyl phosphine, tributylphosphine, trioctylphosphine, and the like, a phosphine compound or an oxide compound thereof such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, and trioctyl phosphine oxide, diphenyl phosphine, a triphenyl phosphine compound or an oxide compound thereof, or a C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid, but the present invention is not limited thereto. The quantum dot may contain a hydrophobic organic ligand alone or as a combination of one or more. The hydrophobic organic ligand (e.g., an acrylate group, a methacrylate group, etc.) may not contain a photopolymerizable moiety.

Referring to FIG. 1, a color conversion layer pattern is not positioned in a portion corresponding to the green emission area GLA and the blue emission area BLA, at a space that is partitioned by the banks 320. Instead, the transmission layer 330 GB may be positioned in a portion corresponding to the green emission area GLA and the blue emission area BLA, in a space that is partitioned by the banks 320. As illustrated in FIG. 1, the transmission layer 330 GB may be positioned in the space partitioned by the banks 320 and also at an upper portion of the banks 320. That is, the transmission layer 330 GB in the space, may extend along a sidewall of the bank 320, out of the space (e.g., further from the second substrate 210 than the bank 320, and along an upper surface of the bank 320 to be disposed at the upper portion thereof. The upper surface of the bank 320 may be a surface which is furthest from the second substrate 210.

Accordingly, as illustrated in FIG. 1, the transmission layer 330 GB positioned in the green emission area GLA and the transmission layer 330 GB positioned in the blue emission area BLA, may be connected to each other in a single pattern. The portion of the transmission layer 330 GB which is positioned between the green emission area GLA and the blue emission area BLA may include a protrusion protruding along the thickness direction and in a direction away from the second substrate 210. The protrusion of the transmission layer 330 GB may constitute a spacer 350. The spacer 350 may be a portion of the transmission layer 330 GB which is furthest from the second substrate 210 among the layers within the stacked structure of the color conversion panel 200.

The transmission layer 330 GB may include scatterers. The scatterers may include one or more selected from a group including $SiO_2$, $BaSO_4$, $Al_2O_3$, ZnO, $ZrO_2$, and $TiO_2$. The transmission layer 330 GB may each include a polymer resin and a scatterer included in the polymer resin. For example, the transmission layer 330 GB may include $TiO_2$, but the present invention is not limited thereto. The transmission layer 330 GB may transmit light incident from the display panel 100.

In this way, in the color conversion panel 200 according to the present embodiment, the red emission area RLA color-converts incident light to red light, and the color-converted light is emitted from the color conversion panel 200 at the red emission area RLA (e.g., a red light emitting area). However, the blue emission area BLA and the green emission area GLA transmit incident light without color conversion. The incident light may be a combination of blue light and green light. Accordingly, among light incident to the blue emission area BLA, green light may be blocked by the blue color filter 230B, and only blue light may be emitted. Accordingly, among light incident to the green emission area GLA, blue light maybe blocked by the green color filter 230G, and only green light may be emitted.

As such, the color conversion panel 200 according to the present embodiment includes a red color conversion layer 330R as a first emission area positioned in the red emission area RLA and a transmission layer 330 GB positioned in both of the green emission area GLA and the blue emission area BLA (e.g., variously a second emission area and a third emission area). The color conversion panel 200 may only include a red color conversion layer 330R. Since a process of forming the green color conversion layer in the green emission area GLA may be omitted, the process may be simplified. That is, the color conversion panel 200 includes only a red color conversion layer 330R and a transmission layer 330 GB (e.g., non-color conversion layer).

In addition, in the case of a high-resolution display device, since a size (e.g., a planar area) of one pixel as a display element becomes small, a space for forming the color conversion patterns in a layer, in each emission area may not be sufficient. However, in the color conversion panel 200 and the display device including the same according to the present embodiment, this problem was solved by forming a color conversion layer pattern in a relatively large red emission area and forming a transmission (non-color conversion) layer pattern in both of the green emission area and the blue emission area which are relatively small in size. In addition, the transmission layer pattern is integrally formed into a single or continuous pattern by portions of the transmission layer pattern in the green emission area and the blue emission area being connected to each other, where such connection portion defines a protrusion formed at an upper portion of the bank 320. Since such a protrusion may function as a spacer 350, a separate spacer forming process may be omitted and a process of providing the color conversion panel 200 may be simplified.

FIG. 1 illustrates an embodiment in which the red color conversion layer 330R does not overlap the transmission layer 330 GB, but the transmission layer 330 GB may be positioned on the red color conversion layer 330R to overlap the red color conversion layer 330R according to an embodiment.

Figure 5:
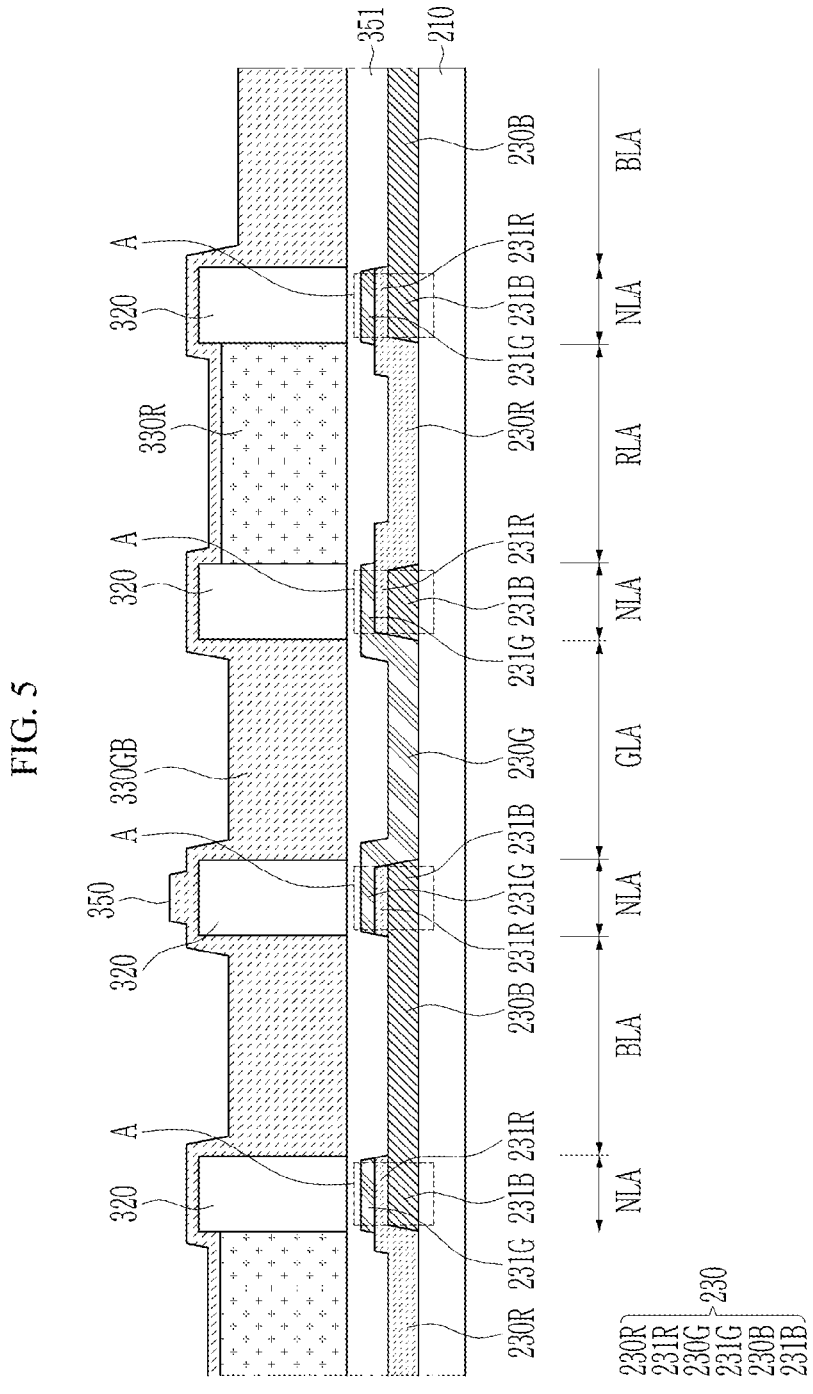
FIG. 5 is a cross-sectional view of a color conversion panel according to an embodiment.

FIG. 5 illustrates a color conversion panel 200 according to an embodiment. Referring to FIG. 5, the color conversion panel 200 according to the present embodiment is the same as the embodiment of FIG. 1 except that the red color conversion layer 330R overlaps the transmission layer 330 GB. A detailed description of the same constituent elements will be omitted.

Referring to FIG. 5, in the color conversion panel 200 according to the present embodiment, the transmission layer 330 GB is positioned on the red color conversion layer 330R. In this case, light that is not color converted in the red color conversion layer 330R is scattered from the transmission layer 330 GB to be incident on the red color conversion layer 330R, thus increasing color conversion efficiency. That is, among incident light, light that is not color-converted by the red color conversion layer 330R may be scattered by the scatterers included in the transmission layer 330 GB to be incident on the red color conversion layer 330R again. The incident light is blue light and green light, and since such light has a short wavelength, it is easily scattered by scatterers. However, since the color-converted light is red light, it may pass through the scatterers without being scattered by the scatterers. Accordingly, when the transmission layer 330 GB overlaps the red color conversion layer 330R, the red light that has already been color-converted is not scattered, but the blue light or green light that has not been color-converted is scattered to re-enter the red color conversion layer 330R, and thus it is possible to increase color conversion efficiency.

Figure 6:
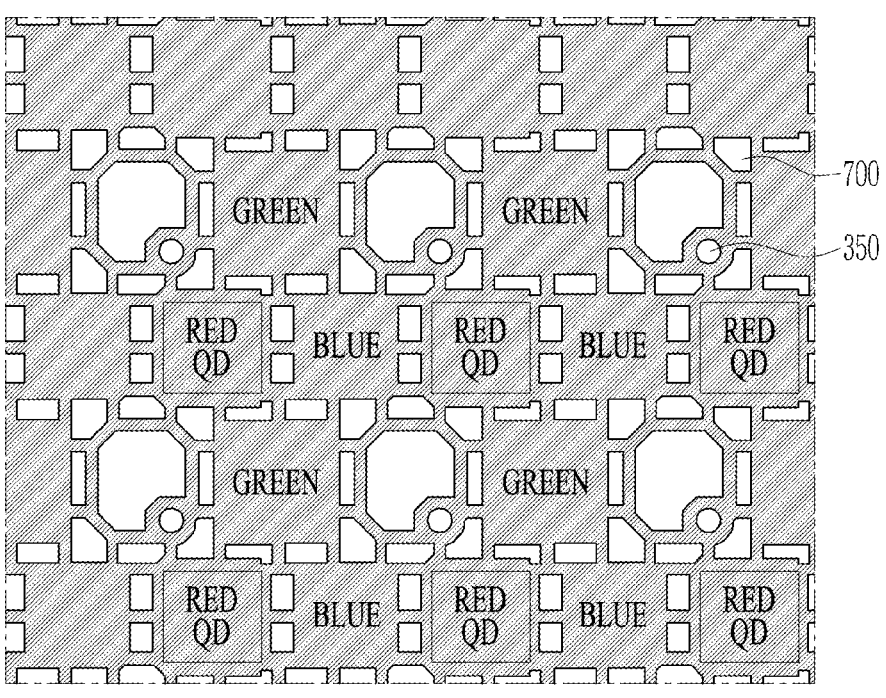
FIG. 6 is a plan view of an emission area of a color conversion panel.

FIG. 6 schematically illustrates an emission area of a color conversion panel 200. Referring to FIG. 6, in the display device according to the present embodiment, a color conversion layer 330R (RED QD) is positioned in a red emission area RLA, and a transmission layer (GREEN and BLUE) is positioned in a green emission area GLA and a blue emission area BLA. In FIG. 6, a spacer 350 and a well 700 are illustrated. As described above, the spacer 350 may be a portion of the transmission layer 330 GB which is furthest from the second substrate 210. The well 700, which is a recessed portion, is an area where a residual material from an inkjet process collects. That is, assuming that the red color conversion layer 330R is formed by an inkjet process, a remaining inkjet material may accumulate in the well 700, and may not invade other emission areas.

FIG. 1 illustrates a color conversion panel 200 according to the present embodiment, and the color conversion panel 200 and the display panel 100 may be coupled to each other, such as being laminated to each other, to form a display device.

Figure 7:
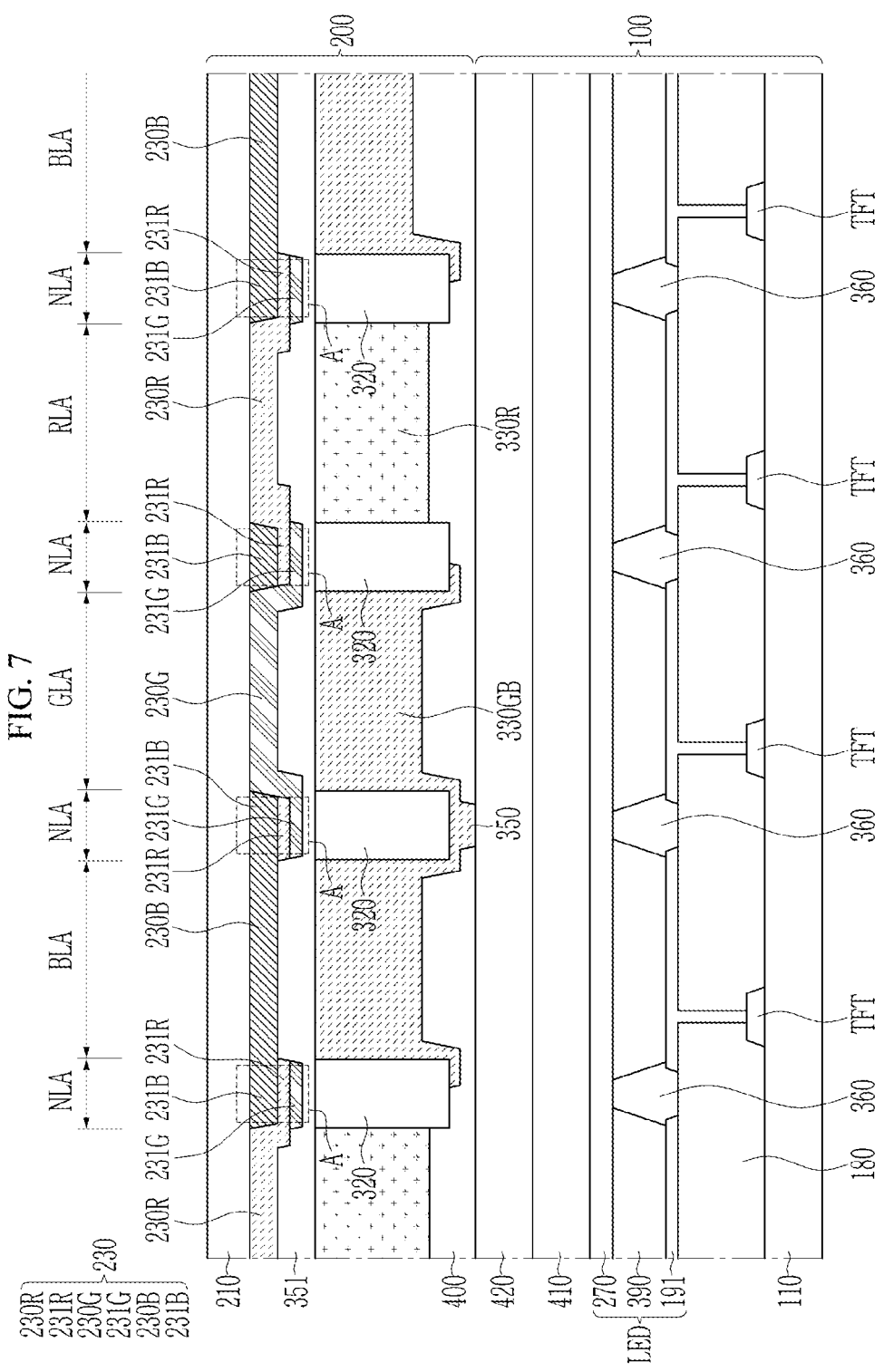
FIG. 7 is a cross-sectional view of a display device according to an embodiment.

FIG. 7 schematically illustrates a cross-section of a display device according to an embodiment. Referring to FIG. 7, the display device according to the present embodiment includes a display panel 100 and a color conversion panel 200. A description of the color conversion panel 200 is the same as in FIG. 1, and thus will be omitted.

The display panel 100 includes a first substrate 110, a transistor TFT provide in plural including a plurality of transistors TFT positioned on the first substrate 110, and an insulating layer 180. The plurality of transistors TFT may form a part of a circuit layer which is connected to a light emitting device. A first electrode 191 and a partition wall 360 of a partition wall layer are positioned on the insulating layer 180 in a same layer. The first electrode 191 is positioned in an opening of the partition wall 360 which is defined by solid portions of the partition wall layer, and is connected to the transistor TFT. Although not specifically illustrated, the transistor TFT may include a semiconductor layer, source and drain electrodes connected to the semiconductor layer, and a gate electrode insulated from the semiconductor layer. A second electrode 270 is positioned on the partition wall 360, and a light emitting layer 390 as a light emission layer is positioned between the first electrode 191 and the second electrode 270.

The first electrode 191, the second electrode 270, and the light emitting layer 390 are collectively referred to as a light emitting device LED. A plurality of light emitting devices LED may provide a light emitting device layer. The light emitting devices LED may emit light of different colors, or may emit light of a same color. For example, the light emitting devices LED may emit light of red, green, and blue. Alternatively, the light emitting devices LED may emit blue light and green light. The light emitting devices LED may have structures in which a plurality of light emitting devices LED emitting different colors from each other, are stacked or aligned along the thickness direction. For example, in the light emitting devices LED, a light emitting layer 390 emitting blue light and a light emitting layer 390 emitting green light may be stacked. Alternatively, light emitting layers 390 emitting blue light, green light, and red light may be stacked. The partition wall 360 may include a black material to prevent color mixing between adjacent light emitting devices LED.

In FIG. 7, an encapsulation layer 410 may be positioned on the light emitting device LED of the display panel 100. The encapsulation layer 410 may have a multi-layered structure in which an organic layer and an inorganic layer are stacked along a thickness direction. Among multi-layered encapsulation layers 410, a layer that is positioned farthest from the first substrate 110 may include SiON.

A buffer layer 420 may be positioned between the encapsulation layer 410 and a first insulating layer 400. The buffer layer 420 may couple the display panel 100 and the color conversion panel 200 to each other. The buffer layer 420 may include an organic material. A refractive index of the buffer layer 420 may be in a range of about 1.6 to 1.7. This refractive index of the buffer layer 420 is in a range of the refractive index in which extraction efficiency of light emitted from the display panel 100 is the best.

In FIG. 7, the first insulating layer 400 positioned at an upper portion of the color conversion panel 200 may be included. The first insulating layer 400 is a layer for capping the red color conversion layer 330R and the transmission layer 330 GB. The first insulating layer 400 may include SiON. A thickness of the first insulating layer 400 may be in a range of about 3500 angstroms (Å) to about 4500 Å. A refractive index of the first insulating layer 400 may be in a range of about 1.4 to about 1.6. The first insulating layer 400 may include an inorganic material.

Figure 8:
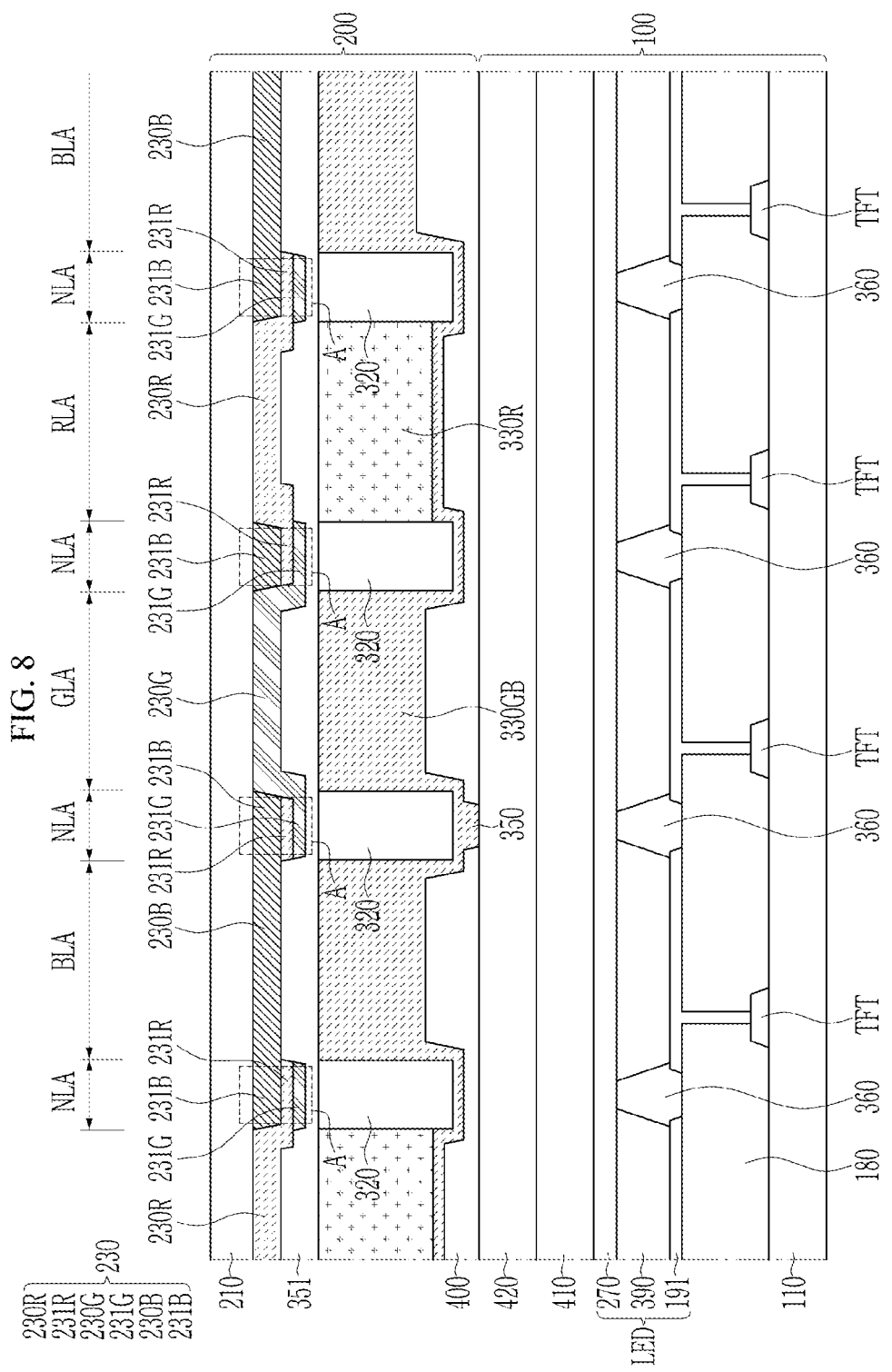
FIG. 8 is a cross-sectional view corresponding to that of FIG. 7 for a display device according to an embodiment.

FIG. 8 illustrates a cross-section corresponding to that of FIG. 7 for a display device according to an embodiment. The display device according to the embodiment of FIG. 8 is the same as the embodiment of FIG. 1 except that the red color conversion layer 330R overlaps the transmission layer 330 GB. A detailed description of the same constituent elements will be omitted.

Referring to FIG. 8, in the display device according to the present embodiment, the red color conversion layer 330R overlaps the transmission layer 330 GB. In this case, light that is not color converted in the red color conversion layer 330R is scattered from the transmission layer 330 GB and is incident on the red color conversion layer 330R, and thus it is possible to increase the color conversion efficiency.

The display device according to the embodiment of FIG. 7 and FIG. 8 includes a color conversion panel 200 and a display panel 100. Accordingly, two substrates are included, such as the first substrate 110 included in the display panel 100 and the second substrate 210 included in the color conversion panel 200, but the invention is not limited thereto. According to an embodiment, the display device may include only one substrate.

Figure 9:
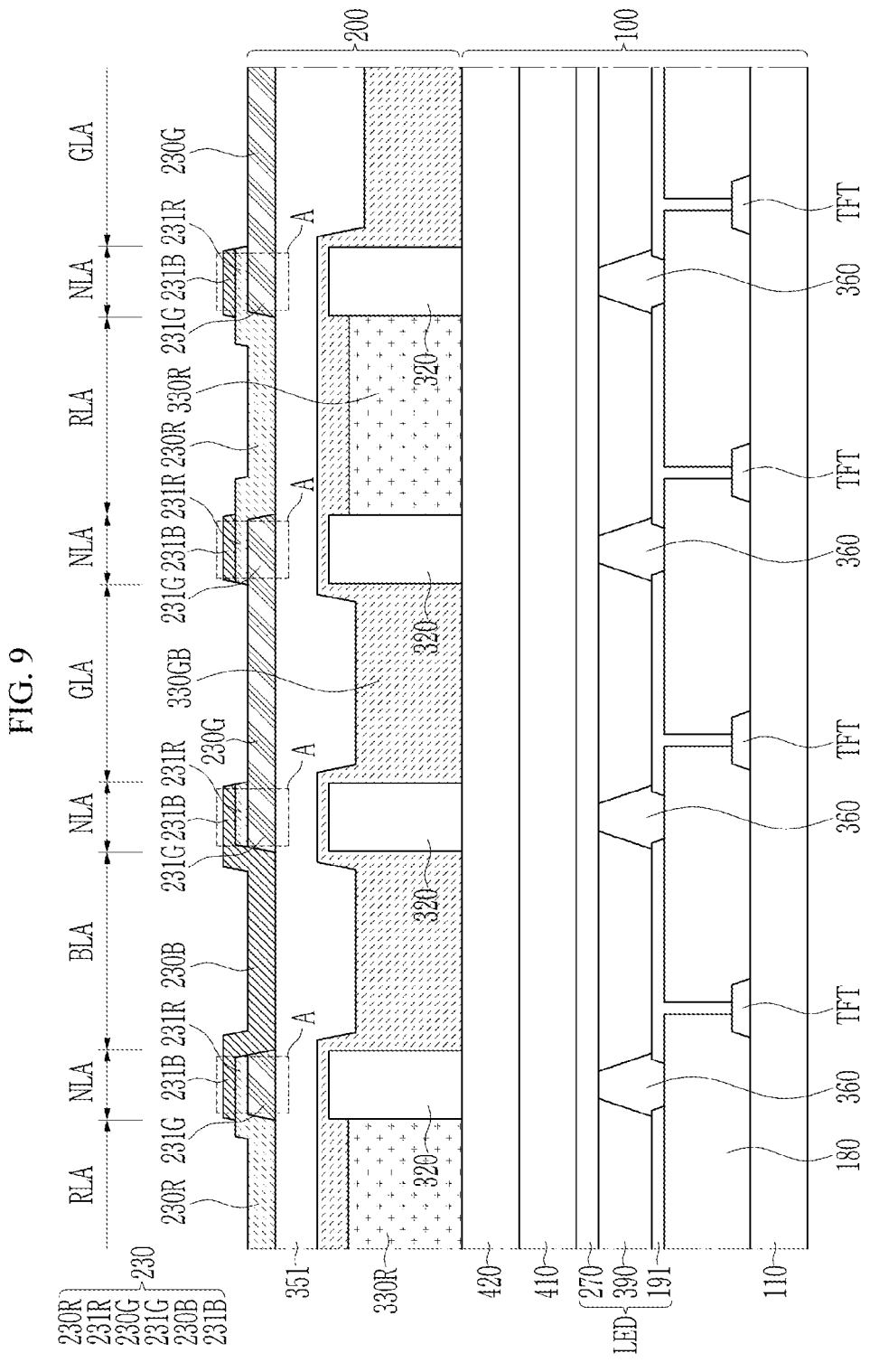
FIG. 9 is a cross-sectional view corresponding to that of FIG. 7 for a display device according to an embodiment.

FIG. 9 illustrates a cross-section corresponding to that of FIG. 7 for a display device according to an embodiment. FIG. 9 is different from FIG. 7 in that the first substrate 110 is included and the second substrate 210 is not included. In the embodiment of FIG. 9, a description corresponding to the display panel 100 is the same as that of FIG. 7, and thus it will be omitted. In the present embodiment, in the case of the color conversion panel 200, a separate second substrate 210 is not included, and instead, the banks 320 are positioned on the buffer layer 420. The banks 320 may form an interface with the buffer layer 420.

A description of the banks 320 is the same as before. A detailed description of the same constituent elements will be omitted. That is, the banks 320 may be positioned to be spaced apart from each other to define a plurality of openings therebetween, and the openings may respectively overlap a color filter pattern among of the color filters 230R, 230G, and 230B in a direction that is perpendicular to a surface of the first substrate 110.

A red color conversion layer 330R and a transmission layer 330 GB are positioned in an area between the banks 320 that are spaced apart from each other. In FIG. 9, a red color conversion layer 330R is positioned in an area overlapping the red emission area RLA. The red color conversion layer 330R may convert supplied light into red light. The red color conversion layer 330R may include quantum dots.

A color conversion layer pattern is not positioned in a portion corresponding to the green emission area GLA and the blue emission area BLA in a space that is partitioned by the banks 320. Instead, the transmission layer 330 GB is positioned in a portion corresponding to the green emission area GLA and the blue emission area BLA in a space that is partitioned by the banks 320. As illustrated in FIG. 7, the transmission layer 330 GB is positioned in the space partitioned by the banks 320 and also in an upper portion of the banks 320 (e.g., a distal end which is furthest from the first substrate 110). Accordingly, as illustrated in FIG. 7, the transmission layer 330 GB positioned in the green emission area GLA and the transmission layer 330 GB positioned in the blue emission area BLA are connected to each other.

In addition, as illustrated in FIG. 9, the transmission layer 330 GB also extends to the red emission area RLA. That is, the transmission layer 330 GB is positioned in all of the red emission area RLA, the green emission area GLA, and the blue emission area BLA.

As such, the transmission layer 330 GB is also positioned on the red emission area RLA, and thus light that is not color converted in the red color conversion layer 330R is scattered again from the transmission layer 330 GB and is incident on the red color conversion layer 330R, and thus it is possible to increase the color conversion efficiency.

The transmission layer 330 GB may include scatterers. The scatterers may include one or more selected from a group including $SiO_2$, $BaSO_4$, $Al_2O_3$, ZnO, $ZrO_2$, and $TiO_2$. The transmission layer 330 GB may include a polymer resin and a scatterer included in the polymer resin. For example, the transmission layer 330 GB may include $TiO_2$, but the present invention is not limited thereto.

A low refractive index layer 351 may be positioned on the transmission layer 330 GB. The low refractive index layer 351 may have a refractive index of about 1.2 or less. The low refractive index layer 351 may be a combination of an organic material and an inorganic material.

A color filter 230 is positioned on the low refractive index layer 351. The color filter 230 may include a blue color filter 230B and a blue dummy color filter 231B, and a green color filter 230G and a green dummy color filter 231G on the red color filter 230R and the red dummy color filter 231R. A description of the blue color filter 230B and the blue dummy color filter 231B, and the green color filter 230G and the green dummy color filter 231G on the red color filter 230R and the red dummy color filter 231R is the same as in FIG. 1, and thus will be omitted.

In the embodiment of FIG. 9, the blue dummy color filter 231B may be positioned farthest from the first substrate 110, and closest to a viewing side of the display device. Accordingly, when the display device according to the embodiment of FIG. 9 is visually viewed, the blue dummy color filter 231B in the color filter overlapping body A may be provided closest to a front side of the display device as the viewing side from which an image is viewed from outside the display device. As described above, the blue dummy color filter 231B in the color filter overlapping body A may be provided closest to a front side of the display device since, compared to green or red, blue has lowest reflectance for all light and can block light most effectively.

In the present embodiment, the red emission area RLA also converts light incident emitted from the display panel 100, to red light in the red color conversion layer 330R to emit the light. However, the blue emission area BLA and the green emission area GLA transmit incident light emitted from the display panel 100, through the transmission layer 330 GB without color conversion. The light emitted from the display panel 100 may be a combination of blue light and green light. Accordingly, among light incident to the blue emission area BLA, green light may be blocked by the blue color filter 230B, and only blue light may be emitted from the blue color filter 230B. Accordingly, among light incident to the green emission area GLA, blue light maybe blocked by the green color filter 230G, and only green light may be emitted from the green color filter 230G.

The same applies when the light emitted from the display panel 100 is a combination of red light, green light, and blue light. That is, in the red emission area RLA, red light may be transmitted, and green and blue light may be color-converted to be emitted. In the green emission area GLA, red light and blue light may be blocked by the green color filter 230G, and only green light may be transmitted. In the blue emission area BLA, red light and green light may be blocked by the red color filter 230R, and only green light may be transmitted.

In the embodiment of FIG. 9, since only one substrate is included, an overall thickness of the entire display device may be reduced. Therefore, a display device having only one substrate may be applied to a flexible or foldable display device.

Figure 10:
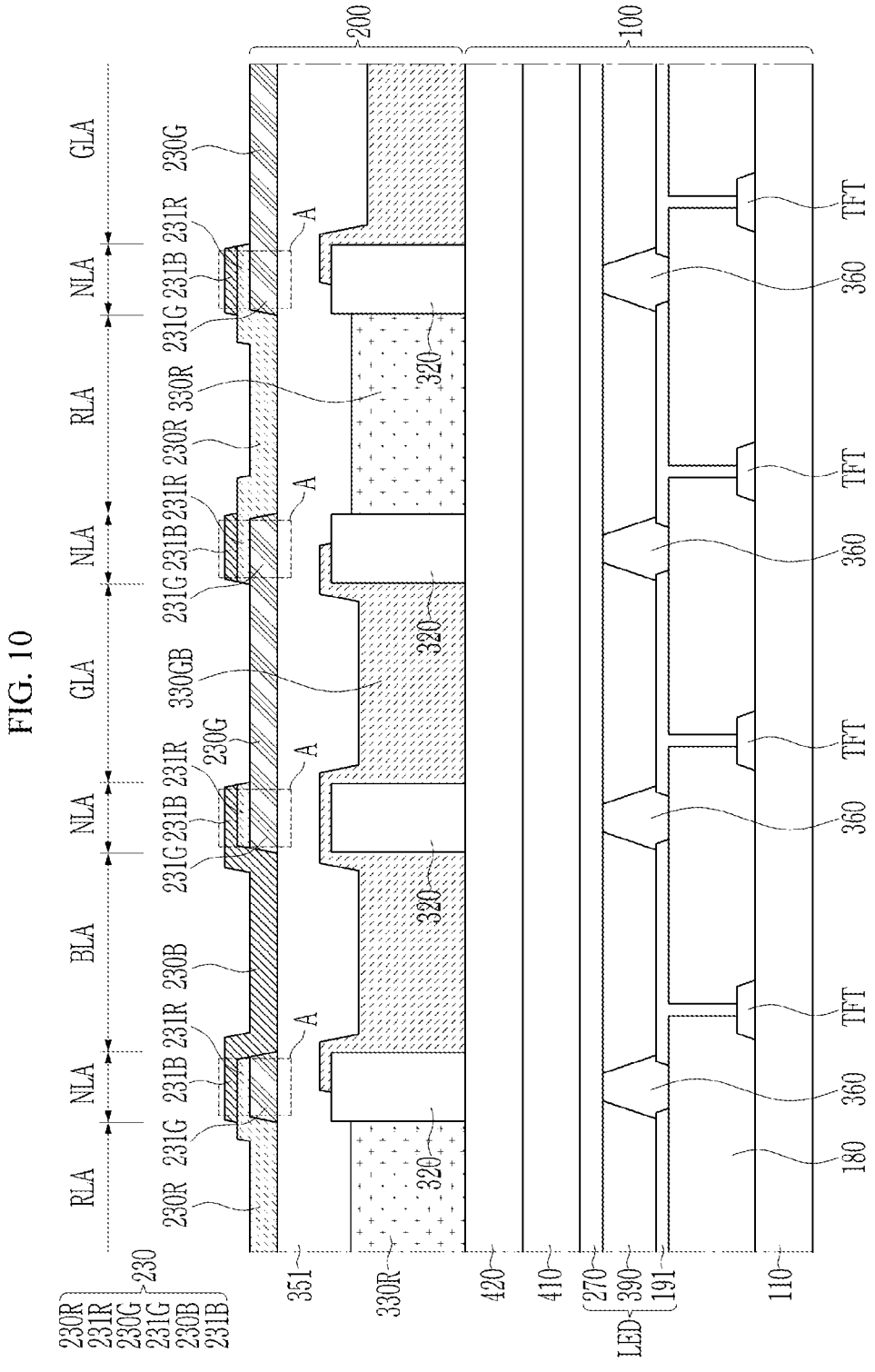
FIG. 10 is a cross-sectional view corresponding to that of FIG. 9 for a display device according to an embodiment.

FIG. 10 illustrates a cross-section corresponding to that of FIG. 9 for a display device according to an embodiment. The embodiment of FIG. 9 is the same as the embodiment of FIG. 10 except that the red color conversion layer 330R and the transmission layer 330 GB do not overlap. Elements which do not overlap may be adjacent to each other along a planar direction, may be spaced apart from each other along the planar direction, etc. A detailed description of the same constituent elements will be omitted.

Figure 11:
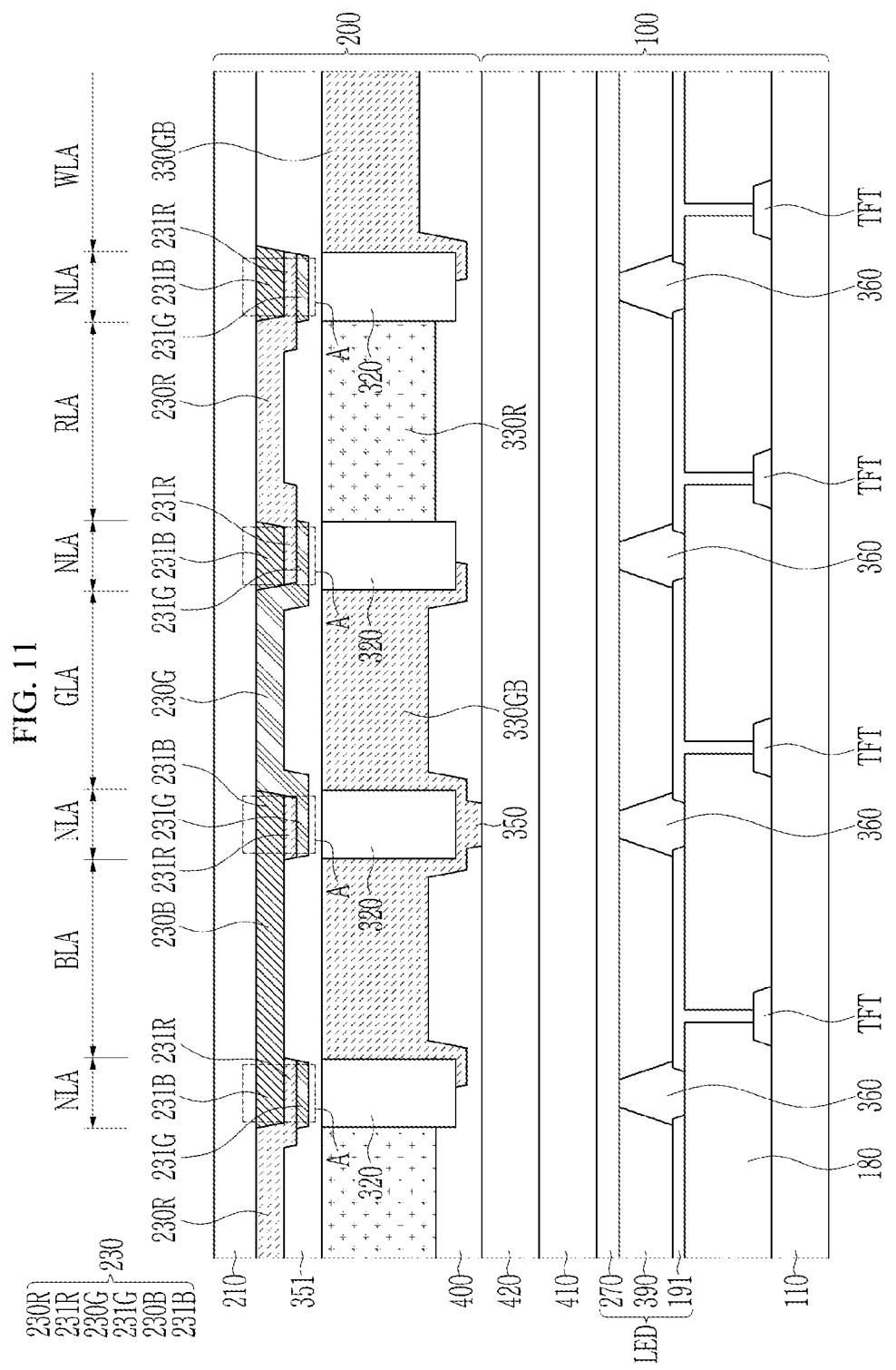
FIG. 11 is a cross-sectional view corresponding to that of FIG. 9 for a display device according to an embodiment.

FIG. 11 illustrates a cross-section corresponding to that of FIG. 7 for a display device according to an embodiment. Referring to FIG. 11, the display device according to the present embodiment is the same as the embodiment of FIG. 7 except that a white emission area WLA is further included. A detailed description of the same constituent elements will be omitted. Referring to FIG. 11, the display device according to the present embodiment further includes the white emission area WLA. The transmission layer 330 GB may be positioned to overlap the white emission area WLA. In the present embodiment, the color filter may not be provided in the white emission area WLA. However, this is only an example, and according to an embodiment, a reflective color filter (not illustrated) positioned to overlap the white emission area WLA may be further included. Such a reflective color filter may prevent reflection of external light. In addition, a color conversion layer pattern other than the transmission layer 330 GB may be positioned in the white emission area WLA. At least one of a red color-converting layer, a green color-converting layer, and a blue color-converting layer may be included in the white emission area WLA at a certain ratio. Thus, even when the incident light is not white light, the white emission area WLA may emit white light by the color conversion of the color conversion layer 330R.

In the previous embodiment, the color-converted light is emitted in a direction that is away from the transistor TFT, but in an embodiment, the color-converted light may be emitted in a substrate direction in which the transistor TFT is positioned (e.g., toward the transistor TFT). Hereinafter, a display device according to an embodiment will be described. The display device to be described below differs from that in the above-described embodiment in the direction in which light is emitted. Since the configuration of the other color conversion layers is the same, a detailed description of the same components will be omitted.

Figure 12:
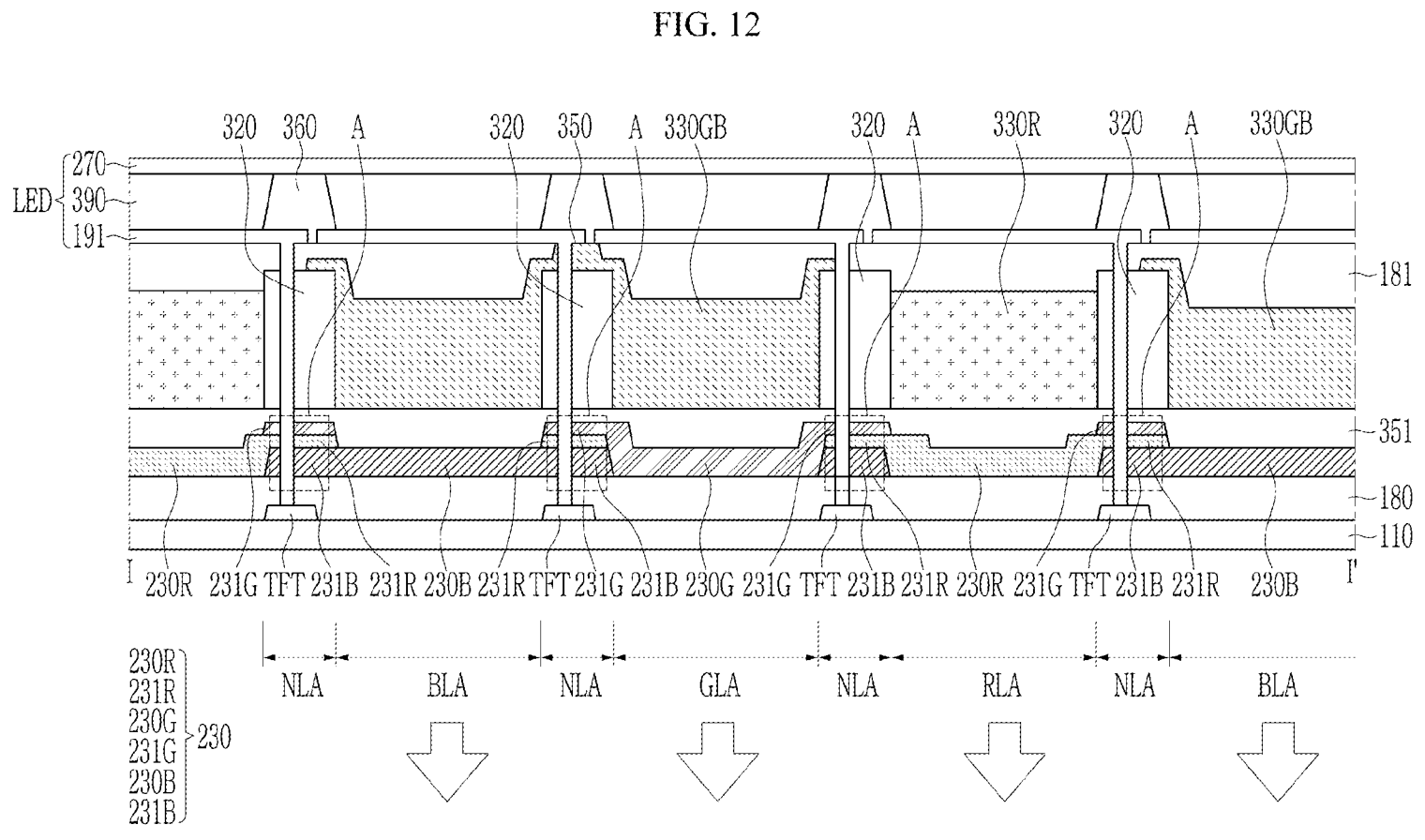

FIG. 12 illustrates a cross-section of a display device according to an embodiment. In the case of the display device according to the above-described embodiment, the light was emitted in a direction away from the substrate on which a transistor TFT is positioned, and it differs from the embodiment described below in that light is emitted toward a substrate on which the transistor TFT is positioned. A direction in which light is emitted is indicated by an arrow in FIG. 12. Since the other components are the same, a detailed description of the same components will be omitted.

Referring to FIG. 12, a plurality of transistors TFT of a transistor layer (or circuit layer), and the insulating layer 180, are positioned on the first substrate 110. In this case, the transistors TFT may be positioned in the non-emission area NLA. That is, in the case of the display device according to the present embodiment, light is emitted toward the first substrate 110 on which the transistors TFT are positioned, and thus the transistors TFT may not be positioned in an emission area of the first substrate 110.

A color filter 230 and a color filter stack A are positioned on the insulating layer 180. A description of each of the color filters 230B, 230R, and 230G, the dummy color filters 231B, 231G, and 231R, and the color filter stack A are the same as those described with reference to FIG. 1 to FIG. 4, and thus will be omitted.

A low refractive index layer 351 may be positioned on the color filter 230. The low refractive index layer 351 may have a refractive index of about 1.2 or less. The low refractive index layer 351 may be a combination of an organic material and an inorganic material.

A plurality of banks 320 may positioned on the low refractive index layer 351. The banks 320 may be positioned to be spaced apart from each other with a plurality of openings therebetween, and the openings may overlap each of the color filters 230R, 230G, and 230B in a direction that is perpendicular to a surface of the second substrate 210. A red color conversion layer 330R and a transmission layer 330 GB are positioned in an area between the banks 320 that are spaced apart from each other. The transmission layer 330 GB may include a protrusion protruding in a direction away from the first substrate 110. The protrusion of the transmission layer 330 GB may constitute a spacer 350. According to an embodiment, the spacer 350 may be omitted. A description of the red color conversion layer 330R and the transmission layer 330 GB is the same as described above, and thus it will be omitted.

A planarization layer 181 may be positioned on the red color conversion layer 330R and the transmission layer 330 GB. The planarization layer 181 may include an organic material, and may provide a flat surface.

A first electrode 191 may be positioned on the planarization layer 181. As illustrated in FIG. 12, the first electrode 191 is connected to the transistor TFT through an opening penetrating the planarization layer 181, the bank 320, the low refractive index layer 351, the color filter stack A, and the insulating layer 180.

A partition wall 360 is positioned on the first electrode 191. The partition wall 360 may be positioned in the non-emission area NLA. That is, the partition wall 360 may be positioned to overlap (or be aligned with) the bank 320 and the transistor TFT. A second electrode 270 is positioned on the partition wall 360, and a light emitting layer 390 is positioned between the first electrode 191 and the second electrode 270. The first electrode 191, the second electrode 270, and the light emitting layer 390 collectively constitute a light emitting device LED.

That is, in the display device according to the present embodiment, the red color conversion layer 330R, the transmission layer 330 GB, and the color filter 230 are positioned between the transistor TFT of a transistor layer and the light emitting element LED of a light emitting element layer which is connected to the transistor layer. Light emitted from the light emitting device LED passes through the color conversion layer 330R or the transmission layer 330 GB, passes through the color filter 230, and exits toward the first substrate 110. Here, the color conversion layers and the color filter layer may constitute a color conversion panel 200, without being limited thereto.

Figure 13:
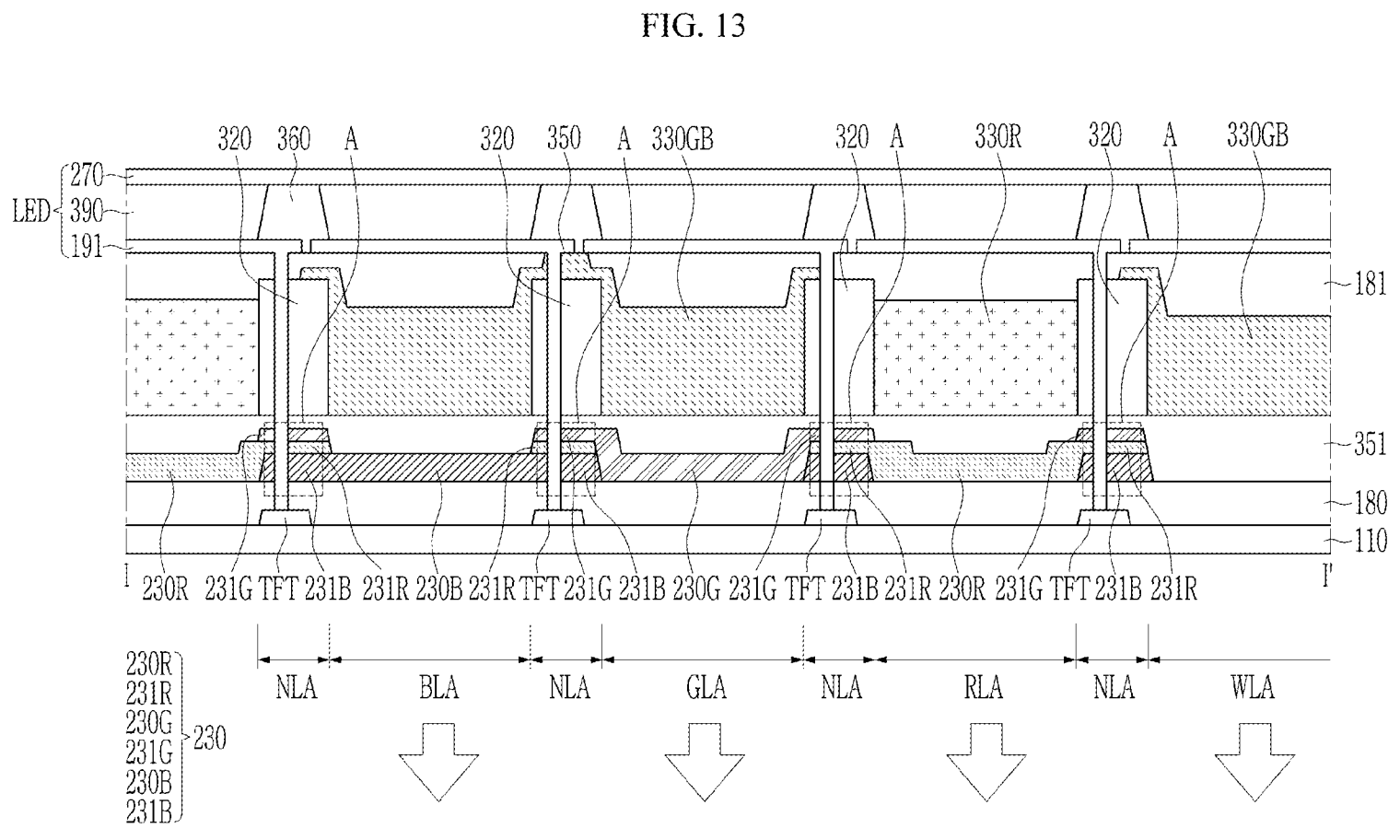

In the previous embodiment, although the display device including the red light emission area RLA, the blue light emission area BLA, and the green light emission area GLA has been described, the display device according to an embodiment may further include the white emission area WLA. FIG. 13 illustrates a cross-section corresponding to that of FIG. 12 for a display device according to an embodiment. Referring to FIG. 13, the display device according to the present embodiment is the same as the embodiment of FIG. 12 except that a white emission area WLA is further included. A detailed description of the same constituent elements will be omitted.

Referring to FIG. 13, the display device according to the present embodiment further includes the white emission area WLA. The transmission layer 330 GB may be positioned to overlap the white emission area WLA. Referring to FIG. 13, in the display device according to the present embodiment, the white emission area WLA does not include a color filter pattern. However, this is only an example, and according to an embodiment, a reflective color filter (not illustrated) positioned to overlap the white emission area WLA may be included. Such a reflective color filter may prevent reflection of external light.

Figure 14:
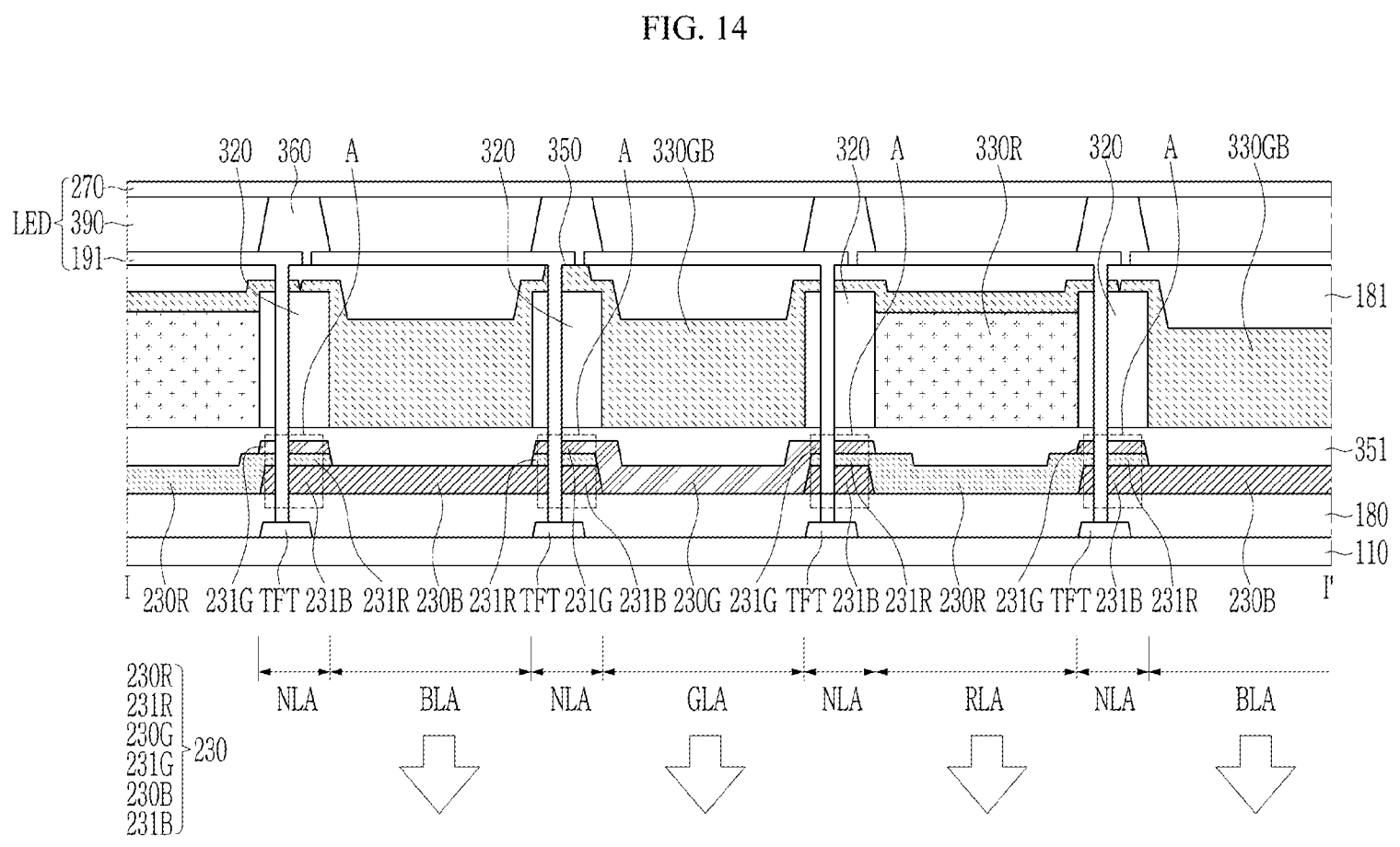

FIG. 14 illustrates a cross-section corresponding to that of FIG. 12 for a display device according to an embodiment. Referring to FIG. 14, the display device according to the present embodiment is the same as the embodiment of FIG. 12 except that the red color conversion layer 330R overlaps the transmission layer 330 GB. That is, the transmission layer 330 GB extends to the red emission area RLA. A detailed description of the same constituent elements will be omitted.

Referring to FIG. 14, in the display device according to the present embodiment, the red color conversion layer 330R overlaps the transmission layer 330 GB. In this case, light that is not color converted in the red color conversion layer 330R is scattered again from the transmission layer 330 GB and is incident on the red color conversion layer 330R, and thus it is possible to increase the color conversion efficiency.

Figure 15:
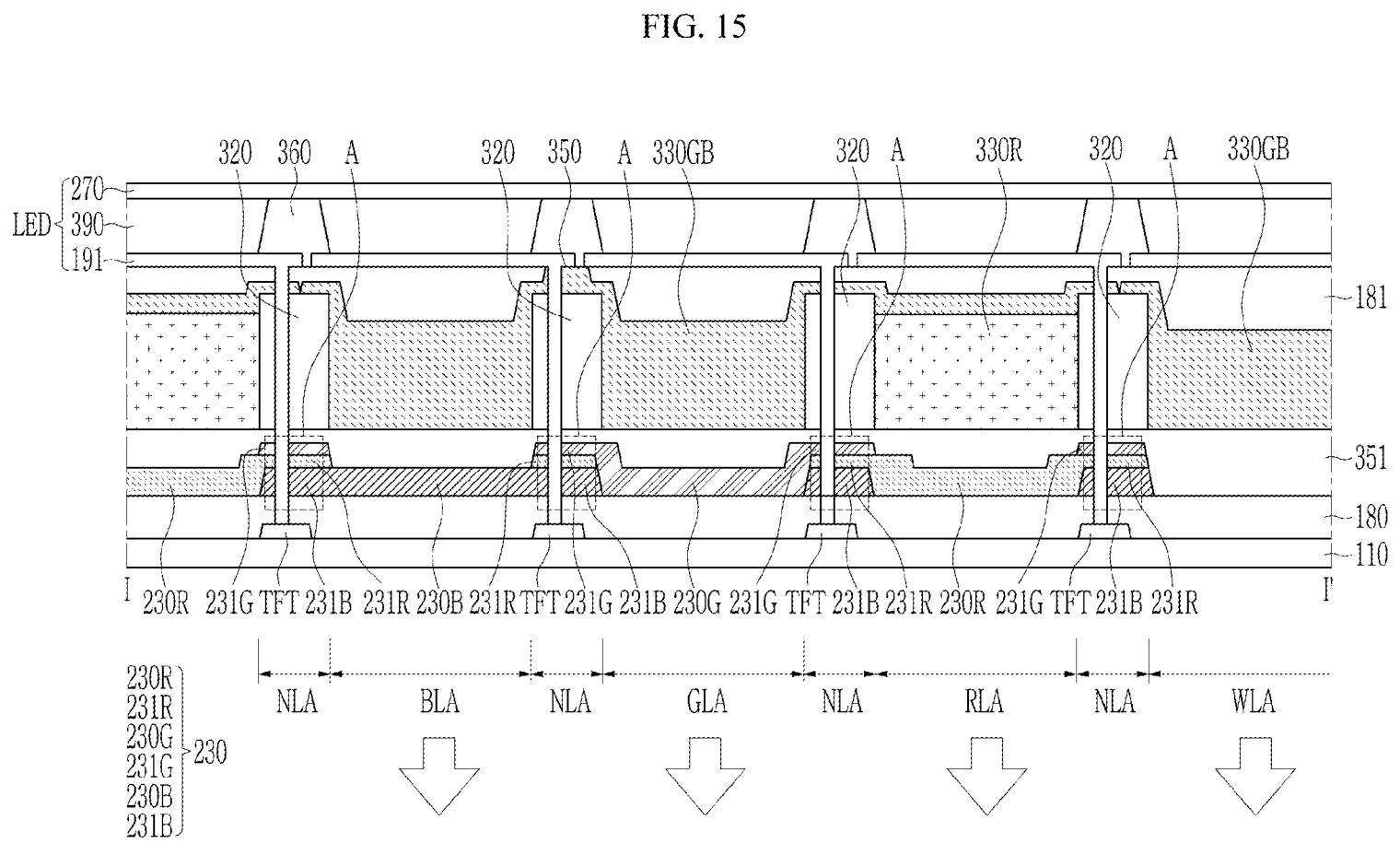

FIG. 15 illustrates a cross-section corresponding to that of FIG. 13 for a display device according to an embodiment. Referring to FIG. 15, the display device according to the present embodiment is the same as the embodiment of FIG. 13 except that the red color conversion layer 330R overlaps the transmission layer 330 GB. That is, the transmission layer 330 GB extends to the red emission area RLA. A detailed description of the same components will be omitted.

Referring to FIG. 15, in the display device according to the present embodiment, the red color conversion layer 330R overlaps the transmission layer 330 GB. In this case, light that is not color converted in the red color conversion layer 330R is scattered again from the transmission layer 330 GB and is incident on the red color conversion layer 330R, and thus it is possible to increase the color conversion efficiency.

As described above, the color conversion panel 200 and the display device including the same according to the present embodiment include the red color conversion layer 330R in the red emission area RLA, and the green emission area GLA and the blue emission BLA area do not include (e.g., exclude) the color conversion layer 330R but include the transmission layer 330 GB. Accordingly, a process of manufacturing or providing the display device may be simplified, and margins for forming (or providing) the color conversion layer 330R in the green and blue emission areas GLA and BLA are omitted, which is advantageous for application to a high-resolution display device. In addition, a portion of the transmission layer 330 GB may be used as a spacer 350 to simplify the manufacturing process.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A color conversion panel comprising:
a plurality of banks which partition a first emission area, a second emission area and a third emission area of the color conversion panel at which light of different colors are respectively emitted from the color conversion panel;
a color conversion layer which color-converts light, in the first emission area; and
a transmission layer which transmits light without color conversion, in the second emission area and the third emission area.

2. The color conversion panel of claim 1, wherein
the transmission layer in the second emission area and the transmission layer in the third emission area are connected to each other at a position corresponding to a bank among the plurality of banks which is between the second emission area and the third emission area.

3. The color conversion panel of claim 1, wherein
the transmission layer extends from the second emission area and along a bank among the plurality of banks which is between the second emission area and the third emission area.

4. The color conversion panel of claim 3, wherein
the transmission layer which extends along the bank protrudes in a direction away from the bank to define a spacer corresponding to the bank.

5. The color conversion panel of claim 1, wherein
the transmission layer extends from the second emission area or the third emission area and along the color conversion layer in the first emission area.

6. The color conversion panel of claim 1, wherein
the first emission area is a red emission area, the second emission area is a green emission area, and the third emission area is a blue emission area.

7. The color conversion panel of claim 6, further comprising a color filter layer comprising a red color filter, a green color filter and a blue color filter respectively corresponding to the first emission area, the second emission area and the third emission area.

8. The color conversion panel of claim 7, wherein
the plurality of banks correspond to a non-emission area of the color conversion panel, and
the color filter layer further comprises the red color filter, the green color filter and the blue color filter each extending to the non-emission area to respectively define a red dummy color filter, a green dummy color filter and a blue dummy color filter in the non-emission area.

9. The color conversion panel of claim 8, wherein
light is emitted from the first emission area, the second emission area and the third emission area, in a light emitting direction,
the red dummy color filter, the green dummy color filter and the blue dummy color filter which are in the non-emission area define a color filter stack in the non-emission area, and among the red dummy color filter, the green dummy color filter and the blue dummy color filter within the color filter stack, the blue dummy color filter is furthest in the light emitting direction.

10. A display device comprising:
a display panel including:
a first substrate;
a plurality of partition walls on the first substrate; and
a light emission layer between the partition walls, and
a color conversion panel facing the display panel, the color conversion panel including:
a second substrate;
a plurality of banks which are on the second substrate and partition a first light emission area, a second emission area and a third emission area of the color conversion panel at which light of different colors are respectively emitted from the color conversion panel;
a color conversion layer in the first emission area; and
a transmission layer which transmits light without color conversion in the second emission area and the third emission area.

11. The display device of claim 10, wherein
the transmission layer in the second emission area and the third emission area in the third emission area are connected to each other at a position corresponding to a bank among the plurality of banks which is between the second emission area and the third emission area.

12. The display device of claim 10, wherein
the transmission layer extends from the second emission area and along a bank among the plurality of banks which is between the second emission area and the third emission area.

13. The display device of claim 12, wherein
the transmission layer which extends along the bank protrudes in a direction away from the bank to define a spacer corresponding to the bank.

14. The display device of claim 10, wherein
the transmission layer extends from the second emission area or the third emission area and along the color conversion layer in the first emission area.

15. The display device of claim 10, wherein
the light emission layer of the display panel emits blue light and green light, and
within the color conversion panel, the first emission area is a red emission area, the second emission area is a green emission area, and the third emission area is a blue emission area.

16. A display device comprising:
a light emission area and a non-emission area which is adjacent to the light emission area;
a plurality of partition walls which correspond to the non-emission area;
a light emission layer between the partition walls and defining a light emitting device layer together with the plurality of partition walls;
a plurality of banks which respectively overlap the partition walls and partition the light emission area into a first emission area, a second emission area and a third emission area at which light of different colors are respectively emitted;
a color conversion layer in the first emission area; and
a transmission layer in the second emission area and the third emission area,
wherein the transmission layer is further from the light emitting device layer than the plurality of banks, along a thickness direction of the display device.

17. The display device of claim 16, wherein
the transmission layer in the second emission area and the transmission layer in the third emission area are connected to each other at a position corresponding to a bank among the plurality of banks which is between the second emission area and the third emission area.

18. The display device of claim 16, wherein
the transmission layer extends from the second emission area and along a bank among the plurality of banks which is between the second emission area and the third emission area.

19. The display device of claim 16, wherein
the transmission layer extends from the second emission area or the third emission area and along the color conversion layer.

20. The display device of claim 16, wherein
the light emission layer emits blue light and green light, and
the first emission area is a red emission area, the second emission area is a green emission area, and the third emission area is a blue emission area.

21. A display device comprising:
a plurality of transistors which define a transistor layer;
a plurality of light emitting devices connected to the plurality of transistors and defining a light emitting device layer; and
between the transistor layer and light emitting device layer:
  a plurality of banks which are on the transistor layer and partition a first light emission area, a second emission area and a third emission area at which light of different colors are respectively emitted from the display device;

a color conversion layer in the first emission area; and
a transmission layer which transmits light without color conversion, in the second emission area and the third emission area.

22. The display device of claim 21, wherein the light emitting device layer emits light in a light emitting direction defined from the light emitting device layer to the transistor layer.

23. The display device of claim 21, wherein the transistors respectively correspond to the plurality of banks.

24. The display device of claim 21, wherein
the first emission area, the second emission area and the third emission area correspond to a light emission area of the display device,
the plurality of transistors correspond to a non-emission area of the display device which is adjacent to the light emission area, and
the color conversion layer and the transmission layer correspond to the light emission area which is adjacent to the non-emission area.

25. The display device of claim 21, wherein
the plurality of banks further partitions a fourth emission area, and
the transmission layer is in the fourth emission area.

26. The display device of claim 21, wherein
the transmission layer extends from the second emission area or the third emission area and along the color conversion layer.

* * * * *